(12) United States Patent
Boilard et al.

(10) Patent No.: US 9,405,335 B1
(45) Date of Patent: Aug. 2, 2016

(54) HEAT PIPE COOLING ARRANGEMENT

(71) Applicant: GOOGLE INC., Mountain View, CA (US)

(72) Inventors: Joshua Boilard, San Francisco, CA (US); Daniel Fourie, San Mateo, CA (US); William Riis Hamburgen, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 240 days.

(21) Appl. No.: 14/186,667

(22) Filed: Feb. 21, 2014

(51) Int. Cl.
*G06F 1/20* (2006.01)
*H05K 5/00* (2006.01)
*H05K 7/20* (2006.01)
*B23P 15/26* (2006.01)

(52) U.S. Cl.
CPC .. *G06F 1/20* (2013.01); *B23P 15/26* (2013.01)

(58) Field of Classification Search
CPC ........... G06F 1/20; G06F 1/203; G06F 1/206; H05K 7/2029; H05K 7/20336; B23P 15/26; H01L 2924/0002; H01L 2924/00; H01L 23/427
USPC ........................ 361/679.46–679.54, 688–723; 165/104.19–104.34, 180, 181, 272
See application file for complete search history.

(56) References Cited

U.S. PATENT DOCUMENTS

| | | | | |
|---|---|---|---|---|
| 2005/0088822 A1* | 4/2005 | Oberlin | ................. | H01L 23/427 361/700 |
| 2005/0117292 A1* | 6/2005 | DiFonzo | ........... | G02F 1/133308 361/679.52 |
| 2005/0150649 A1* | 7/2005 | Tsukamoto | ............. | F28F 3/022 165/185 |
| 2005/0257532 A1* | 11/2005 | Ikeda | ...................... | F25B 21/02 62/3.7 |
| 2009/0008066 A1* | 1/2009 | Meng | .................... | F04D 29/582 165/104.33 |
| 2009/0059532 A1* | 3/2009 | Li | .......................... | H01L 23/427 361/709 |
| 2009/0268392 A1* | 10/2009 | Cheng | ..................... | G06F 1/203 361/679.52 |
| 2010/0079953 A1* | 4/2010 | Okutsu | ................... | G06F 1/203 361/700 |
| 2011/0249400 A1* | 10/2011 | Watanabe | ............... | G06F 1/203 361/695 |
| 2012/0140403 A1* | 6/2012 | Lau | ....................... | H01L 23/427 361/679.47 |
| 2013/0327507 A1* | 12/2013 | Degner | ................... | G06F 1/203 165/120 |
| 2014/0340841 A1* | 11/2014 | Yu | ........................... | G06F 1/203 361/679.47 |
| 2015/0062802 A1* | 3/2015 | Grunow | .................. | H01L 23/34 361/679.47 |

* cited by examiner

Primary Examiner — Anthony Haughton
Assistant Examiner — Yahya Ahmad
(74) Attorney, Agent, or Firm — Brake Hughes Bellermann LLP

(57) ABSTRACT

A method of using a heat pipe to spot cool a component in a computer case involves disposing an evaporator portion of the heat pipe to be laterally or horizontally adjacent to, but not in direct contact with, the component in the computer case. The method further involves thermally coupling the laterally adjacent component and the evaporator portion of the heat pipe with a bridging heat transfer component.

25 Claims, 8 Drawing Sheets

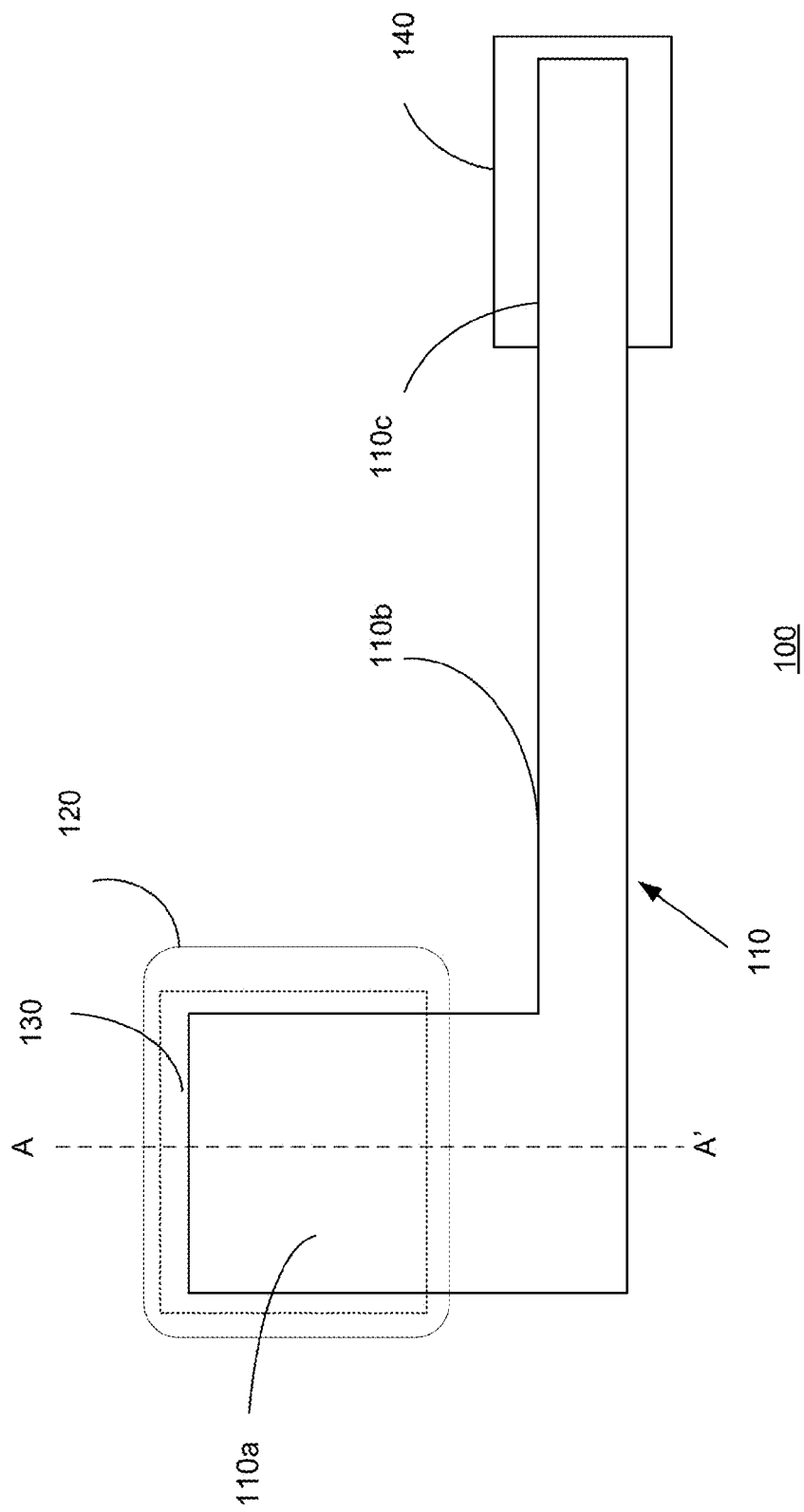

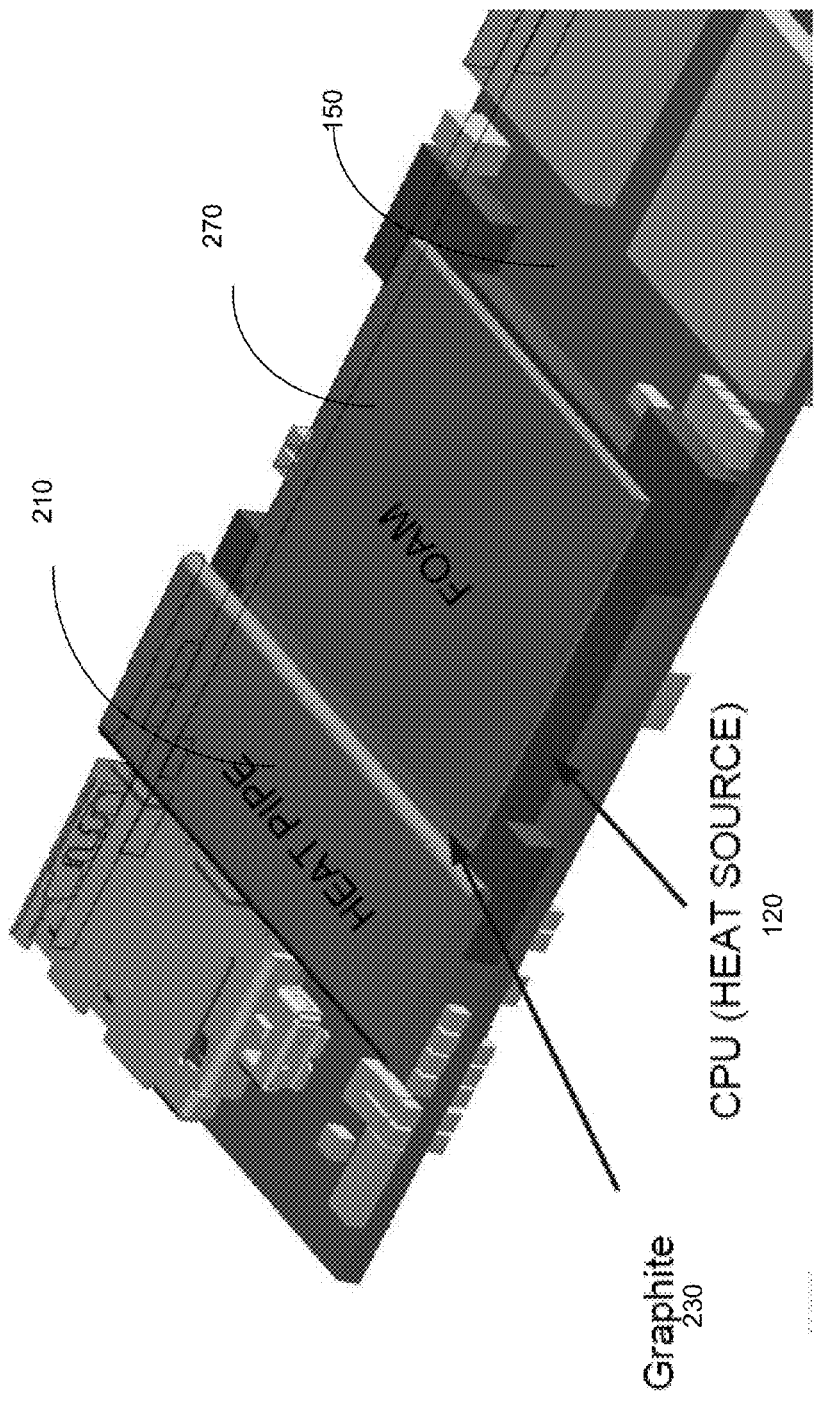

400

410
Utilizing a heat pipe to spot cool a component disposed in a computer case of a computer

420
Disposing an evaporator portion of the heat pipe horizontally or laterally adjacent to the component in the computer case

422
Attaching the heat pipe to a second wall (e.g., a floor wall) opposite the first wall from which the component is extending and further attaching a pressing element (e.g., urethane foam, or other resilient material) to the second wall

424
arranging the position of heat pipe on the second wall so that when the computer case is assembled the evaporator portion of the heat pipe extends from the second wall to a position laterally or horizontally adjacent to the component extending from the first wall

426
arranging the position of the pressing element so that when the computer case is assembled the pressing element is directly over the component and a surface of the pressing element extending from the second wall presses against a surface of the component extending from the first wall

430
Thermally coupling the laterally adjacent component and evaporator portion of the heat pipe with a bridging heat transfer component

432
Extending a thermally conductive sheet (e.g., a metal foil or a graphite sheet) from the component to the evaporator portion of the heat pipe

434
Attaching a first portion of the thermally conductive sheet to the evaporator portion of the heat pipe and a second portion of the thermally conductive sheet to the surface of a pressing element (e.g., a piece of foam) that presses toward the surface of the component extending from the first wall, and using the pressing element to press the second portion of the thermally conductive sheet against a surface of the component extending from the first wall

FIG. 4

HEAT PIPE COOLING ARRANGEMENT

TECHNICAL FIELD

This description relates to cooling of electrical or electronic components of a computing device. In particular, the description relates to extracting heat from heat-generating computer components including integrated circuits such as CPUs, chipsets, and graphics cards to avoid overheating of the computer components.

BACKGROUND

Cooling systems ("computer cooling systems") are deployed in computers to remove waste heat produced by computer components and to keep computer components (e.g., integrated circuits) within permissible operating temperature limits. Computer components that are susceptible to temporary malfunction or permanent failure if overheated include integrated circuits such as CPUs, chipsets, graphics cards, and hard disk drives.

Common computer cooling systems may include one or more cooling components, for example, fans, heat sinks, heat pipes, and thermoelectric coolers (TECs). The computer cooling systems may be designed to reduce the ambient temperature within the case of a computer, e.g., by exhausting hot air, or to cool a single component or small area (spot cooling) individually. Components that are individually cooled may, for example, include integrated circuits (e.g., CPUs, chipsets, graphics cards, GPUs, etc.) that are susceptible to temporary malfunction or permanent failure if overheated.

In modern computers (e.g., laptops, smart phones, tablets, notebook computers, etc.), which have increasingly thin profiles or form factors and yet increasingly more powerful integrated circuits, space within a computer case for cooling system components may be limited. The space limitations of a thin computer case may make it difficult to fit sufficient cooling system components in the computer case.

Thus, a need exists for systems, methods, and apparatus to address the shortfalls of present technology and to provide other new and innovative features.

SUMMARY

A computer cooling system for cooling a computer component in an electronic enclosure uses a heat pipe to remove heat generated by the computer component. The computer component (e.g., an integrated circuit mounted on a printed circuit board) may extend from a first wall of the electronic enclosure. An end (e.g., an evaporator portion) of the heat pipe is thermal coupled to the computer component. An evaporation-condensation cycle of a working fluid transfers heat from an evaporator portion to a condenser portion of the heat pipe.

In a general aspect of the computer cooling system, the evaporator portion of the heat pipe is disposed laterally or horizontally adjacent to, but not in direct mechanical contact with, the computer component in the electronic enclosure. A thermal coupling element (e.g., a metal foil, a graphite or graphene sheet) extends from the evaporator portion of the heat pipe to the computer component. Thermal adhesives (e.g., thermal grease) may be used for thermal contact between the thermal coupling element and the evaporator portion and between the thermal coupling element and the computer component.

In an implementation, the evaporator portion of the heat pipe is attached to, and extends from, a second wall of the electronic enclosure, the second wall being substantially parallel to and facing the first wall of the electronic enclosure. In an alternate implementation, the evaporator portion of the heat pipe is attached to, and extends from, the first wall of the electronic enclosure.

In an aspect of either implementation, a pressing element is attached to the second wall directly over the computer component extending from the first wall. The pressing element has a surface that presses against a surface of the computer component extending from the first wall. A first portion of the thermal coupling element is attached to the evaporator portion of the heat pipe and a second portion of the thermal coupling element is attached the surface of the pressing element that presses against the surface of the computer component extending from the first wall.

In a general aspect, a computer enclosure is formed by a first horizontal wall facing a second horizontal wall. The two walls, which may be substantially parallel, are separated by a vertical distance. A heat pipe is used for spot cooling of a heat-generating component (e.g., an integrated circuit) in the computer enclosure. An evaporator portion of the heat pipe is disposed horizontally or laterally adjacent to, but not in direct mechanical contact with, the heat-generating component. A thermal coupling element (e.g., a metal foil, a graphite or graphene sheet) extends from the evaporator portion of the heat pipe to the heat-generating component.

In an aspect, the heat-generating component includes an integrated circuit mounted on a printed circuit board attached to the first horizontal wall of the computer enclosure, and the evaporator portion of the heat pipe is attached to the second horizontal wall of the electronic enclosure that faces the first horizontal wall of the electronic enclosure. A portion of the thermal coupling element, which is attached to and extends form the evaporator portion of the heat pipe, is pressed against a surface of the computer component by a pressing element extending from second horizontal wall directly above the computer component.

In an aspect, a height of a vertical stack formed by the pressing element, the thermal coupling element, and the integrated circuit mounted on the printed circuit board attached to the first horizontal wall of the computer enclosure is less than about 4.00 mm. The vertical distance separating the first horizontal wall and the second horizontal wall of the computer enclosure is at most about 4 mm. Including thicknesses first horizontal wall and the second horizontal wall, the computer enclosure may have a thickness of about 6 mm.

In a general aspect, a method of using a heat pipe to cool a heat-generating component disposed in a computer case of a computer includes disposing an evaporator portion of the heat pipe to be laterally or horizontally adjacent to, but not in direct mechanical contact with, the heat-generating component in the computer case. The method further includes thermally coupling the laterally or horizontally adjacent heat-generating component and the evaporator portion of the heat pipe with a bridging heat transfer component. The bridging heat transfer component may be a thermally conductive sheet extending from the heat-generating component to the evaporator portion of the heat pipe.

The details of one or more implementations are set forth in the accompanying drawings and the description below. Other features will be apparent from the description and drawings, and from the claims.

BRIEF DESCRIPTION OF THE DRAWINGS

FIGS. 1A and 1B are schematic illustrations of an example deployment of a heat pipe in a vertically stacked arrangement to spot cool a computer integrated circuit (e.g., a CPU module).

FIGS. 3A and 3B are schematic illustrations of another example deployment of a heat pipe in a side-by-side arrangement to spot cool a computer integrated circuit in a computer case, in accordance with the principles of the disclosure herein.

FIG. 4 is a flow chart illustrating an example method for cooling a component (e.g., an integrated circuit, CPU, GPU, etc.) disposed in a computer case of a computer, in accordance with the principles of the disclosure herein.

Like reference symbols in the various drawings indicate like elements.

DETAILED DESCRIPTION

Figure 1B:
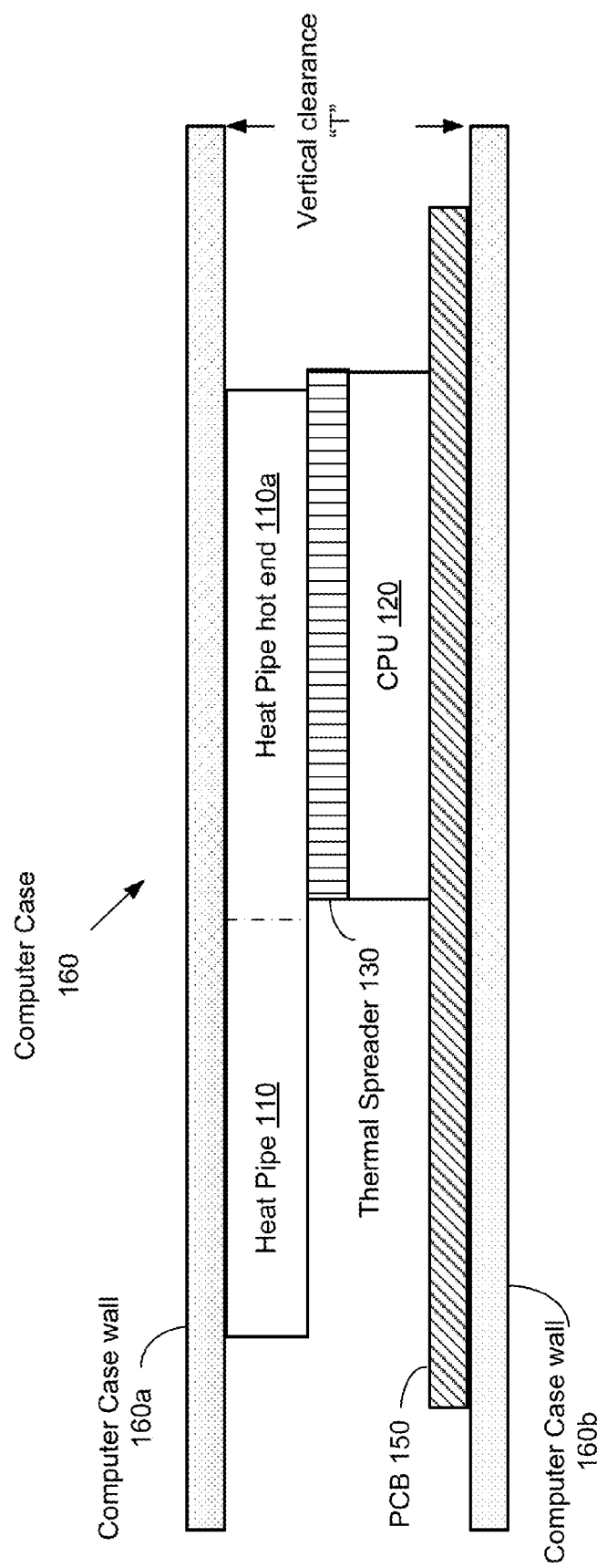

Arrangements for deploying a computer cooling system in a computer case are described herein. In accordance with the principles of the disclosure herein, the arrangements, which utilize heat pipes as heat transfer or cooling elements, are configured not to limit how thin or slim the computer case can be made because of the inclusion of the computer cooling system in the computer case.

A heat pipe is a closed evaporator-condenser device which exploits a thermodynamic cycle of phase transitions in a fluid to transfer heat from one end of the device to another end of the device. A heat pipe may be made formed as a sealed, hollow tube containing a thermodynamic working fluid (e.g., alcohol, distilled water with various additives, organic substances like acetone, methanol, ethanol, toluene, etc.) having a substantial vapor pressure at a desired operating temperature. The heat pipe may include a heat input portion ("evaporation portion" or "hot end") and a heat dissipation portion ("condensation portion" or "cool end") separated by an insulating or adiabatic section. The fluid in the heat tube may absorb heat and evaporate at the hot end of the tube. The evaporated fluid (vapor) may travel under its own vapor pressure across the adiabatic section to the cool end of the tube, where it may re-condense as a liquid, giving up a latent heat of condensation. The cooled liquid may return to the hot end of the tube by gravity or capillary action and repeat the evaporation-condensation cycle transferring heat from the hot end to the cool end in the process. A heat pipe may have a much higher effective thermal conductivity than solid materials for heat transfer.

In a computer cooling system, a heat pipe may be used for spot cooling of heat generating components (e.g., integrated circuits), which, for example, may be mounted on a printed circuit board in a computer case. In an example computer cooling system, a heat pipe, which may have a flat surface, may be placed or stacked on top of a CPU mounted on the printed circuit board in the computer case. The CPU, which may have a shape of a square or a rectangular plate, may have a thermal spreader (e.g., a flat metallic sheet or a finned heat sink) on its top surface. The hot end of the heat pipe (e.g. a flat heat pipe) may be placed over or on top of the CPU in thermal contact with the thermal spreader in a vertically stacked arrangement. Thermal grease may be used to facilitate the thermal contact. The cool end of the heat pipe may be attached to a remote heat radiator or heat sink (or the computer case itself) to disperse the heat transferred from the CPU by the thermodynamic working fluid in the heat pipe.

To accommodate the vertically stacked arrangement of the computer cooling system described in the foregoing, the computer case may have an internal vertical clearance that is sufficiently large not only to clear a height of the CPU (and other circuits) mounted on the printed circuit board but also to clear the added height due to the thickness of heat pipe placed or stacked on the thermal spreader on top of the CPU in the vertically stacked arrangement.

FIGS. 1A and 1B schematically show an example deployment of a heat pipe 110 to spot cool a computer integrated circuit (e.g., CPU module 120) in a vertically stacked arrangement 100. FIG. 1A is a top plan view of the example deployment of heat pipe 110 to spot cool CPU module 120. Heat pipe 110, which may be constructed of copper, aluminum or other material, may be a linear, curved or complex-shaped tube. As seen in the figure, heat pipe 110 may be, for example, a flat, L-shaped tube. Heat pipe 110 may have a hot end 110a, an adiabatic section 110b and a cool end 110c. Hot end 110a of heat pipe 110 may be have a flat surface, which may be placed over CPU module 120 in intimate thermal contact (e.g., via a thermal spreader 130 attached to the CPU) with a top surface of the CPU. The other end of heat pipe 110 (i.e. cool end 110c) may be placed in contact with a remote heat sink or thermal spreader 140 (or the computer case itself) to disperse heat extracted from CPU module 120 by vaporization of the thermodynamic working fluid in heat pipe 110.

FIG. 1B shows a vertical cross sectional view of vertically stacked arrangement 100 disposed in a computer case 160 (e.g., of a laptop computer) between case bottom and case top walls 160a and 160b. As shown in the figure, in vertically stacked arrangement 100, CPU module 120 may be mounted on a printed circuit board 150 disposed in computer case 160. Thermal spreader 130, which may, for example, be a metal sheet or other thermally conductive material, may be placed over a top surface of CPU module 120 and may be held firmly against CPU module 120 by screws threaded in screw posts (not shown) extending to PCB 150. Thermal spreader 130 may be configured so that hot end 110a of heat pipe 110 disposed on CPU module 120 is in good thermal contact with CPU module 120.

As shown in FIG. 1B, computer case 160 may have a vertical clearance "T" i.e. a vertical separation between walls 160a and 160b, to accommodate electronic circuits and components placed in the computer case. Vertical clearance, T, of computer case 160 may be dimensionally constrained to be at a minimum no less than the combined thicknesses of vertically stacked arrangement 100 (including the thicknesses of heat pipe 110, thermal spreader 130 and CPU module 120, and a thickness or a height of printed circuit board 150 from wall 160b). This dimensional constraint of a required minimum vertical separation of the walls of computer case 160 places a limit on how thin computer case 160 can be made.

For example, in vertically stacked arrangement 100, CPU module 120 may have a thickness of 2.41 mm, printed circuit board 150 may have a thickness of 1.0 mm, thermal spreader 130 may have a thickness of 0.5 mm, and heat pipe 110a may have a thickness of 1.00 mm, for a combined thickness of about 4.91 mm. Thus, computer case 160 may require a minimum vertical clearance, T, of at least 4.91 mm to accommodate vertical arrangement 100. Even with computer case walls 160a and 160b (made of high strength metals such as magnesium or alloys) each having a thickness of about 1.0 mm, computer case 160 may be no thinner than about 6.91 mm.

In accordance with the principle of the disclosure herein, a heat pipe is deployed to extract heat from a heat-generating electrical component (e.g., an integrated circuit) in an electronic enclosure or case without placing a constraint on a required minimum vertical separation of the walls of the electronic enclosure or case to accommodate the thickness of the heat pipe. In accordance with the principles of the disclosure herein, the heat pipe and heat-generating electrical component are disposed in a "side-by-side" lateral or horizontal arrangement in the electronic enclosure or case. The heat pipe and heat-generating electrical component may be laterally separated and not in direct contact with each other. A thermally conductive sheet or ribbon thermally couples the heat pipe and the heat-generating electrical component, which are not in direct contact with each other. The thermally conductive sheet or ribbon, which may be flexible, may be made of a high thermal conductivity material (e.g., copper, graphite or composite material).

A height of the side-by-side arrangement of the heat pipe and the heat-generating electrical component mounted in the computer case can be less than a height of a vertically stacked arrangement (e.g., a vertically stacked arrangement 100) in which the heat pipe is disposed or stacked over the heat-generating electrical component.

Figure 2A:
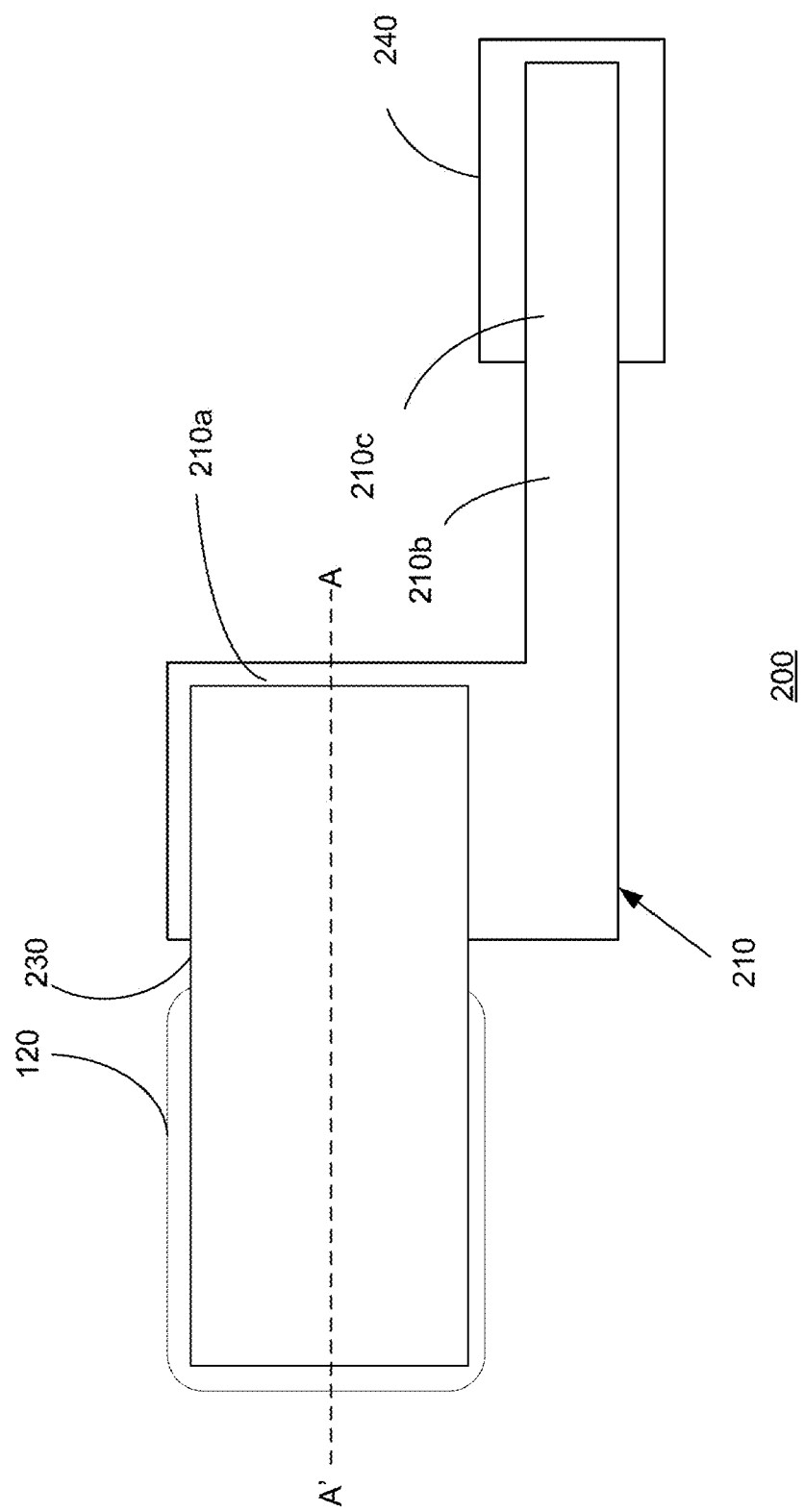
FIGS. 2A and 2B are schematic illustrations an example deployment of a heat pipe in a side-by-side lateral or horizontal arrangement to spot cool a computer integrated circuit (e.g., a CPU module) in a computer case, in accordance with the principles of the disclosure herein.
Figure 2B:
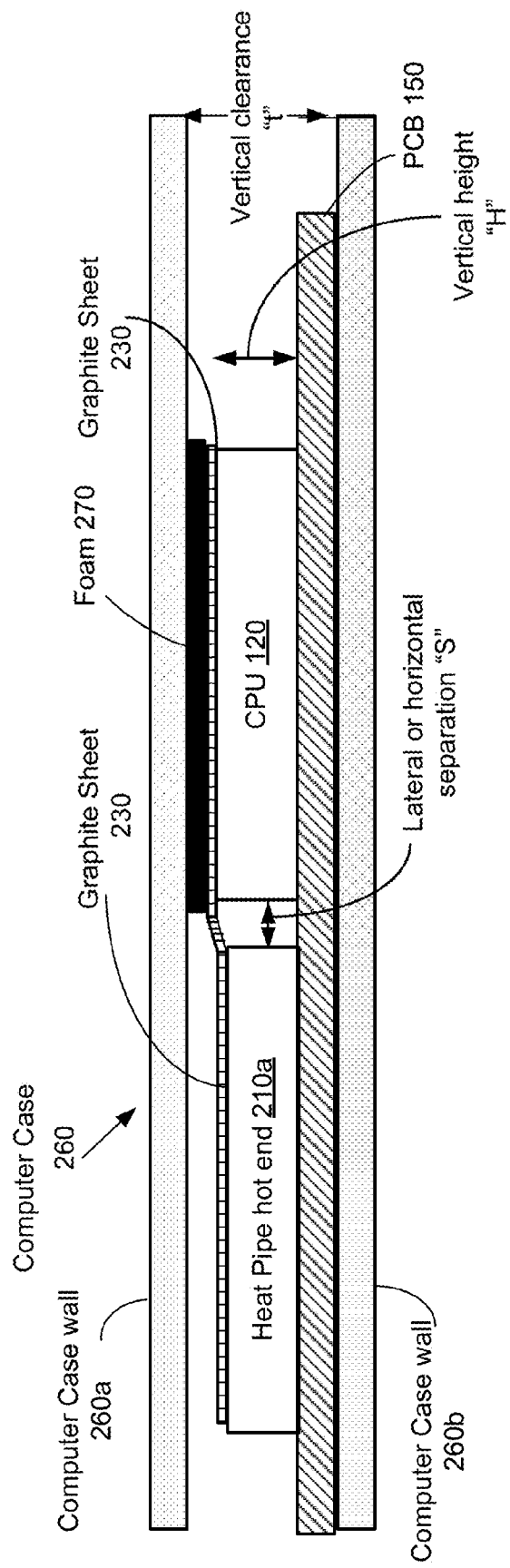

FIGS. 2A and 2B schematically show an example deployment of a heat pipe 210 to spot cool a computer integrated circuit (e.g., CPU module 120) in a side-by-side lateral or horizontal arrangement 200 in a computer case 260. FIG. 2A shows a top plan view of the example deployment of heat pipe 210 to spot cool CPU module 120. Heat pipe 210, which may be constructed of copper, aluminum or other material, may be a linear, curved or complex-shaped tube. As seen in the figure, heat pipe 210 may, for example, be a flat L-shaped tube. Heat pipe 210 may have a hot end 210a, an adiabatic section 210b and a cool end 210c. Hot end 210a of heat pipe 210 may be positioned or seated adjacent to, but not in direct mechanical contact with, CPU module 120. CPU module 120 and hot end 210a may be thermally coupled by a thermally conductive sheet 230 (e.g., a graphite sheet) placed over a surface of CPU module 120 and a surface of hot end 210a. Thermally-conductive sheet 230 may be attached to the top surface of CPU module 120 and to hot end 210a using thermally conductive adhesives or thermal grease. The other end of heat pipe 210 (i.e. cool end 210c) may be placed in contact with a remote heat sink or thermal spreader 240 (or the computer case wall itself) to disperse heat extracted from CPU module 120 by vaporization of the thermodynamic working fluid in heat pipe 210.

FIG. 2B shows a vertical cross sectional view of side-by-side arrangement 200 disposed in a computer case 260 (e.g., of a laptop computer) between case bottom and top walls 260a and 260b. As shown in the figure, in side-by-side arrangement 200, CPU module 120 may be mounted on a printed circuit board 150 disposed in computer case 260. Printed circuit board 150 may be generally planar in a horizontal or lateral direction and CPU module 120 as mounted on the board may extend to a height "H" above printed circuit board 150 in a vertical direction. Hot end 210a of heat pipe 210 may be disposed laterally adjacent to, but not in direct mechanical contact with, CPU module 120. Hot end 210a and CPU module 120 may, for example, be separated in the lateral or horizontal direction by a distance "S". Hot end 210a of heat pipe 210 may be seated on printed circuit board 150 as shown for example in the figure, or in alternative implementation (see e.g., FIG. 2C) may be seated or mounted directly on computer case wall 260a adjacent to CPU module 120.

In side-by-side arrangement 200, thermally conductive sheet 230 (e.g., a graphite sheet) may be placed over and attached to CPU module 120 and hot end 210a to provide thermal coupling between the two components. Graphite sheet 230 may be attached to CPU module 120 and hot end 210a using, for example, thermally conductive adhesives (not shown). In an implementation, graphite sheet 230 may be mechanically pressed and held firmly against the top surface of CPU module 120 by a foam layer 270 (e.g., a urethane foam layer) disposed between the top surface of CPU module 120 and computer case wall 260a.

As shown in FIG. 2B, computer case 260 may have a vertical clearance "t" i.e. a vertical separation between walls 260a and 260b, to accommodate electronic circuits and components placed in the computer case. Vertical clearance, t, of computer case 260 may be dimensionally constrained to be at a minimum no less than the thicknesses of side-by side arrangement 200. The vertical thickness of side-by side arrangement 200 may, for example, be the greater of the individual thicknesses of heat pipe 210 or CPU module 120 mounted on printed circuit board 150. Unlike the example of vertically stacked arrangement 100, it may not be necessary to add the thickness of the heat pipe to the thickness of CPU module 120 to determine the minimum vertical clearance, t, required to accommodate side-by side arrangement 200 in computer case 260.

In an example side-by-side arrangement 200, CPU module 120 may have a thickness of 2.41 mm, printed circuit board 150 may have a thickness of 1.0 mm, thermally-conductive sheet 230 may have a thickness of 0.1 mm, foam layer 270 may have a thickness of 0.4 mm and a heat pipe may have a thickness of 1.00 mm. However, since the heat pipe is placed adjacent to the CPU module in side-by-side arrangement 200, the thickness of the heat pipe may not contribute to the combined vertical thickness of side-by-side arrangement 200, which may be about 3.91 mm. Thus, computer case 260 may have a minimum vertical clearance, t, requirement of only about 3.91 mm. With computer case walls 260a and 260b (made of high strength materials such as magnesium or magnesium alloys) each having a thickness of about 1.0 mm, computer case 260 may be as thin as about 5.91 mm, i.e. less than about 6 mm thick. In example implementations, computer case walls 260a and 260b may, for example, include one or more of magnesium, magnesium alloys, aluminum, aluminum alloys, and other high strength composite materials.

Figure 3A:
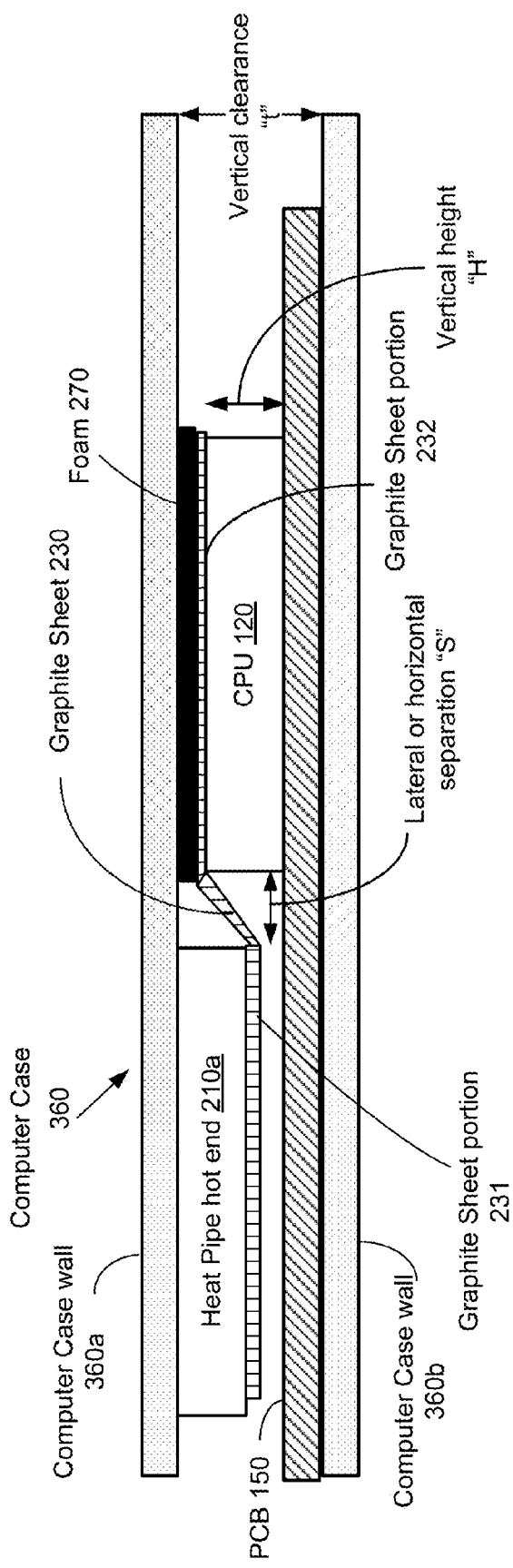

FIGS. 3A and 3B shows another example deployment of a heat pipe to spot cool an integrated circuit in a side-by-side arrangement 300 in a computer case 360, which may be thinner than about 6 mm in thickness. In the example implementation shown in FIG. 3A, CPU module 120 may be mounted on printed circuit board 150, which is attached to wall 360b of computer case 360. Printed circuit board 150 may be generally planar in a horizontal or lateral direction and CPU module 120 as mounted on the board may extend to a height "H" above printed circuit board 150 in a vertical direction. Hot end 210a of heat pipe 210 and a pressing element (e.g., foam layer 270) may be attached to opposite wall 360a of computer case 360. A first portion 231 of graphite sheet 230 may be attached to a surface of hot end 210a. Graphite sheet 230 may continue from first portion 231 to a second portion 232, which may be attached to a surface of foam layer 270.

Hot end 210a may be positioned on wall 360a so that when walls 360a and 360b are assembled together to make computer case 360, hot end 210a of heat pipe 210 is laterally or horizontally adjacent to, but not in direct mechanical contact with, CPU module 120. Hot end 210a and CPU module 120 may, for example, be separated from each other in the lateral or horizontal direction by a distance "S". Further, foam layer 270 may be positioned on wall 260a so that when walls 360a and 360b are assembled together to make computer case 360, foam layer 270 presses attached portion 232 of graphite sheet 230 against a top surface of CPU module 120. In operation, heat generated by CPU module 120 may be conducted through attached portion 232 of graphite sheet 230 and transferred to heat pipe 210 via attached portion 231 of graphite sheet 230.

As in the example side-by-side arrangement 200 described above, using example thicknesses of CPU module 120 (2.41 mm), printed circuit board 150 (1.00 mm), graphite sheet 270 (0.1 mm) and foam layer 270 (0.4 mm), a vertical separation of case walls 360a and 360b required in computer case 360 to accommodate side-by-side arrangement 300 may be computed to be 3.91 mm. Thus, with wall 360a and 360b thicknesses of about 1.0 mm each, computer case 360 may be only about 5.91 mm or 6 mm thick.

FIG. 3B shows an isometric view of side-by-side arrangement 300 and portion of printed circuit board 150, as may be deployed in computer case 360.

FIG. 4 shows an example method 400 for cooling a component (e.g., an integrated circuit, CPU, GPU, etc.) disposed in a computer case of a computer, in accordance with the principles of the disclosure herein. The component (e.g., a CPU) may be mounted on, and extend from, a printed circuit board that is attached to a first wall in the computer case. Method 400 includes utilizing a heat pipe to spot cool the component (410). In particular, method 400 includes disposing an evaporator portion of the heat pipe horizontally or laterally adjacent to, but not in direct mechanical contact with, the component in the computer case (420), and thermally coupling the laterally adjacent component and the evaporator portion of the heat pipe with a bridging heat transfer component (430). Thermally coupling the laterally adjacent component and evaporator portion of the heat pipe may include extending a thermally conductive sheet (e.g., a metal foil or a graphite sheet) from the component to the evaporator portion of the heat pipe (432). A first portion of the thermally conductive sheet may be placed in contact with a surface of the component and a second portion of the thermally conductive sheet may be placed in contact with the evaporator portion of the heat pipe. Heat generated by the component during computer operation may be transferred to the evaporator portion of the heat pipe via the thermally conductive sheet.

In a scenario where the heat-generating component extends from a first wall (e.g., a ceiling wall) of the computer case, disposing an evaporator portion of the heat pipe horizontally or laterally adjacent to the component in the computer case 420 may include attaching the heat pipe to a second wall (e.g., a floor wall) opposite the first wall from which the component is extending and further attaching a pressing element (e.g., urethane foam, or other resilient material) to the second wall (422). Attaching the heat pipe to a second wall may include arranging the position of heat pipe on the second wall so that when the computer case is assembled, the evaporator portion of the heat pipe extends from the second wall to a position laterally or horizontally adjacent to the component extending from the first wall (424). Further, attaching a pressing element to the second wall may include arranging the position of the pressing element so that when the computer case is assembled, the pressing element is directly over the component and a surface of the pressing element extending from the second wall presses against a surface of the component extending from the first wall.

Thermally coupling the laterally adjacent component and evaporator portion of the heat pipe 430 may including attaching a first portion of a thermally conductive sheet to the evaporator portion of the heat pipe and a second portion of the thermally conductive sheet to the surface of the pressing element (e.g., a piece of foam) that presses toward the surface of the component extending from the first wall, and using the pressing element to press the second portion of the thermally conductive sheet against a surface of the component extending from the first wall (434). Thus, the thermally conductive sheet (e.g., a metal foil or a graphite sheet) may be placed in thermal contact with both the component and the evaporator portion of the heat pipe in the computer case.

Figure 5:
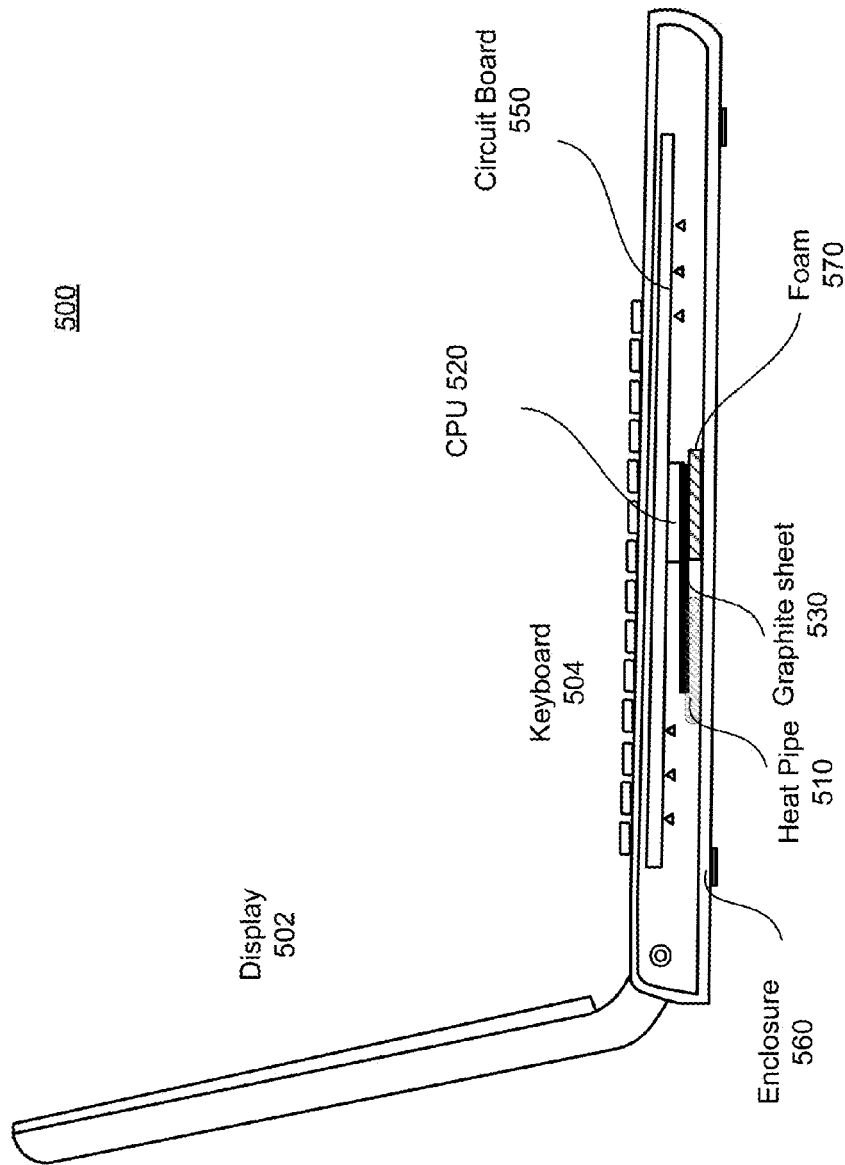
FIG. 5 is a schematic illustration of a laptop computer in which a heat pipe is used to spot cool a CPU, in accordance with the principles of the disclosure herein.

FIG. 5 shows a cross sectional view of a laptop computer 500 in which a heat pipe is used to spot cool a CPU, in accordance with the principles of the disclosure herein. Laptop computer 500, which may have a clamshell form factor, may include a display 502, a keyboard portion 504, and an enclosure 560 housing a circuit board 550. A heat-generating CPU 520 may be mounted on circuit board 550. Heat-generating CPU 520 may be spot cooled by heat pipe 510, which laterally displaced from and not in direct contact with heat-generating CPU 520. However, heat-generating CPU 520 and heat pipe 510 may be thermally coupled to each other by a bridging heat transfer component i.e. graphite sheet 530. A portion of graphite sheet 530 extending from heat pipe 510 may be pressed or biased against a surface of CPU 520 by a piece of foam 570 or other resilient material attached to the enclosure wall opposite CPU 520. In operation, heat generated by CPU 520 may be transferred via graphite sheet 530 to heat pipe 510 for extraction and dispersal.

A limited number of implementations of computer cooling systems in computer cases or electronic enclosures have been described herein. Nevertheless, it will be understood that various modifications may be made without departing from the spirit and scope of this disclosure or the following claims.

What is claimed is:

1. A computer cooling system for cooling a computer component in an electronic enclosure, the system comprising:
a heat pipe including:
a condenser portion; and
an evaporator portion in direct physical contact with one of a first wall or a second wall of the electronic enclosure, the second wall being parallel to and facing the first wall, the evaporator portion being disposed laterally adjacent to and spaced apart from, but not in direct mechanical contact with, the computer component such that the evaporator portion and the computer component do not overlap, the computer component being coupled to one of the first wall or the second wall of the electronic enclosure; and
a thermal coupling element extending from the evaporator portion of the heat pipe to the computer component.

2. The computer cooling system of claim 1, wherein the thermal coupling element includes a metal foil.

3. The computer cooling system of claim 1, wherein the thermal coupling element includes a graphite sheet.

4. The computer cooling system of claim 3, wherein the graphite sheet has thickness of about 0.1 mm.

5. The computer cooling system of claim 1, wherein the computer component is coupled to the first wall of the electronic enclosure, and wherein the thermal coupling element is disposed between the computer component and a pressing element extending from the second wall of the electronic enclosure.

6. The computer cooling system of claim 1, wherein the computer component includes an integrated circuit mounted on a printed circuit board in the electronic enclosure.

7. The computer cooling system of claim 6, wherein the computer component is coupled to the first wall of the electronic enclosure and the evaporator portion of the heat pipe is directly attached to, and extends from, the second wall of the electronic enclosure.

8. The computer cooling system of claim 7, further comprising a pressing element having a first surface attached to the second wall, the pressing element disposed directly over the computer component so that a second surface of the pressing element presses against a surface of the computer component extending from the first wall.

9. The computer cooling system of claim 8, wherein a first portion of the thermal coupling element is attached to the evaporator portion of the heat pipe and a second portion of the thermal coupling element is attached to the second surface of the pressing element that presses against the surface of the computer component extending from the first wall.

10. The computer cooling system of claim 9, wherein the thermal coupling element includes a graphite sheet and the pressing element includes foam material.

11. A computer enclosure formed by a first horizontal wall facing a second horizontal wall, the first horizontal wall and the second horizontal wall separated by a vertical distance, the computer enclosure comprising:
a heat-generating component;
a heat pipe having an evaporator portion and a condenser portion, the evaporator portion of the heat pipe disposed horizontally adjacent to and spaced apart from, but not in direct mechanical contact with, the heat-generating component, such that the evaporator portion of the heat pipe and the heat-generating component do not vertically overlap; and
a thermal coupling element extending from the evaporator portion of the heat pipe to the heat-generating component.

12. The computer enclosure of claim 11, wherein the thermal coupling element includes a graphite sheet in thermal contact with the evaporator portion of the heat pipe and with the heat-generating component.

13. The computer enclosure of claim 11, wherein the thermal coupling element includes a metal foil in thermal contact with the evaporator portion of the heat pipe and with the heat-generating component.

14. The computer enclosure of claim 11, wherein the thermal coupling element includes a thermally conductive sheet having a thickness of about 0.1 mm.

15. The computer enclosure of claim 11, wherein the heat-generating component includes an integrated circuit mounted on a printed circuit board attached to the first horizontal wall of the computer enclosure, and wherein the evaporator portion of the heat pipe is attached to and in direct physical contact with the second horizontal wall of the electronic enclosure that faces the first wall of the electronic enclosure.

16. The computer enclosure of claim 15, further comprising a pressing element attached to, and extending from, the second horizontal wall directly above the heat-generating component, the thermal coupling element being pressed against a surface of the computer component by the pressing element extending from second horizontal wall directly above the computer component.

17. The computer enclosure of claim 16, wherein the pressing element includes foam material.

18. The computer enclosure of claim 16, wherein a height of a vertical stack formed by the pressing element, the thermal coupling element, and the integrated circuit mounted on the printed circuit board attached to the first horizontal wall of the computer enclosure is less than about 4.00 mm, and wherein the vertical distance separating the first horizontal wall and the second horizontal wall of the computer enclosure is at most about 4 mm.

19. The computer enclosure of claim 18, wherein the first horizontal wall and the second horizontal wall include one or more of magnesium, magnesium alloys, aluminum and aluminum alloys.

20. A method of using a heat pipe to cool a component disposed in a computer case of a computer, the method comprising:
disposing an evaporator portion of the heat pipe in direct contact with one of a first wall or a second wall of the computer case to be laterally adjacent to and spaced apart from, but not in direct mechanical contact with, the component in the computer case, the component being coupled to one of the first wall or the second wall; and
thermally coupling the laterally adjacent component and the evaporator portion of the heat pipe with a bridging heat transfer component.

21. The method of claim 20, wherein thermally coupling the laterally adjacent component and the evaporator portion of the heat pipe with the bridging heat transfer component includes extending a thermally conductive sheet from the component to the evaporator portion of the heat pipe.

22. The method of claim 21, wherein extending a thermally conductive sheet from the component to the evaporator portion of the heat pipe includes extending a sheet of graphite from the component to the evaporator portion of the heat pipe.

23. The method of claim 20, wherein the component is coupled to the first wall of the computer case, and wherein disposing the evaporator portion of the heat pipe in direct contact with one of a first wall or a second wall of the computer case to be laterally adjacent to the component in the computer case includes attaching the evaporator portion of the heat pipe to the second wall of the computer case, the second wall facing the first wall.

24. The method of claim 23 further comprising attaching a pressing element to the second wall so that when the computer case is assembled the pressing element is directly over the component and a surface of the pressing element presses against a surface of the component extending from the first wall.

25. The method of claim 24 further comprising attaching a thermally conductive sheet to a surface of the heat pipe and attaching a portion of the thermally conductive sheet extending from the heat pipe to the surface of the pressing element that presses against the surface of the component extending from the first wall.

* * * * *